(12) United States Patent
Harrison

(10) Patent No.: US 6,421,071 B1
(45) Date of Patent: Jul. 16, 2002

(54) SYNCHRONOUS SCROLLING OF TIME STAMPED LOG FILES

(75) Inventor: Michael John Harrison, Wood Dale, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/329,235

(22) Filed: Jun. 10, 1999

(51) Int. Cl.[7] ............................................... G06K 15/00
(52) U.S. Cl. ........................................ 345/787; 345/802
(58) Field of Search ................................ 345/787, 786, 345/785, 784, 769, 739, 738, 802, 766, 767, 837; 707/10

(56) References Cited

U.S. PATENT DOCUMENTS

| | | | | |
|---|---|---|---|---|
| 5,371,851 A | * | 12/1994 | Pieper et al. | ............... 345/785 |
| 5,757,370 A | * | 5/1998 | Amro et al. | ................ 345/787 |
| 5,771,032 A | * | 6/1998 | Cline et al. | ................. 345/788 |
| 5,943,051 A | * | 8/1999 | Onda et al. | ................. 345/786 |

* cited by examiner

*Primary Examiner*—Steven Sax
(74) *Attorney, Agent, or Firm*—Sitrick & Sitrick

(57) ABSTRACT

A computer based data analyzing system includes a memory storing a plurality of different log files. The memory is accessed to select a group of log files for simultaneous display in corresponding windows of a display device. A scroll command accesses the memory to simultaneously scroll the group of log files displayed in the corresponding windows with respect to a common parameter, such as a time stamp.

13 Claims, 4 Drawing Sheets

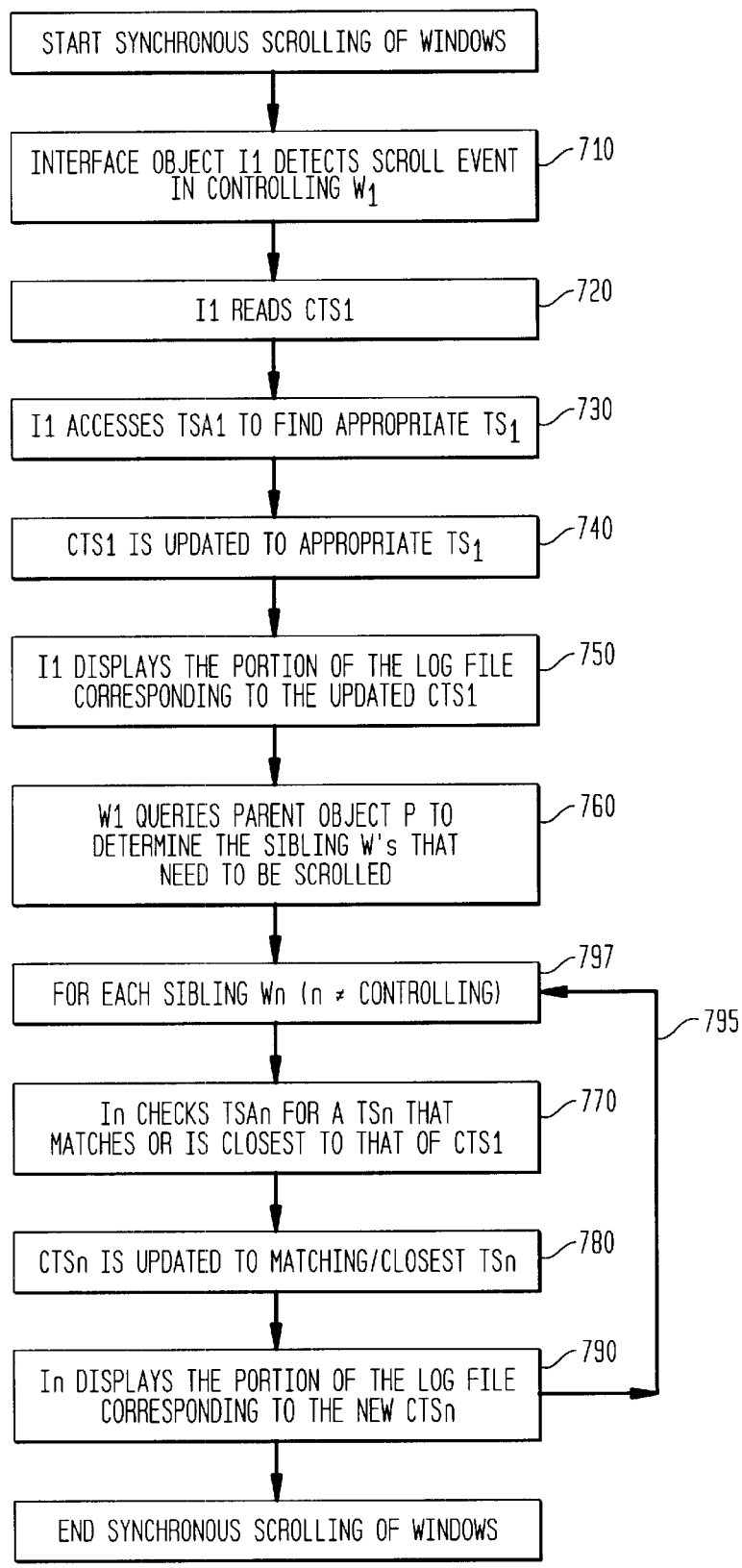

SYNCHRONOUS SCROLLING OF TIME STAMPED LOG FILES

BACKGROUND OF THE INVENTION

This invention relates generally to computer based automated testing systems and particularly to analyzing the output of automated test session runs. Such testing systems may, for example, include a number of sensors for providing test data, at various interfaces of the test system, into a database of different log files, on a time stamp or other basis. Presently, the user (engineer) utilizes a text editor to switch back and forth between log files (displayed on a monitor) to view information occurring at similar time stamps when analyzing the test results. The present practice is time-consuming and inconvenient for the engineer and is not conducive to an enhanced analysis that would be possible if all of the related data could be viewed simultaneously.

SUMMARY OF THE INVENTION

In accordance with the present invention, provision is made for analyzing data in a group of log files that are displayed in separate windows of a display device. The group of log files share a common parameter, such as a time stamp, and the log files in the separate windows may be simultaneously scrolled, with respect to the common parameter, by a single scroll command.

OBJECTS OF THE INVENTION

A principal object of the invention is to provide a novel automated test method and apparatus.

Another object of the invention is to provide a method and apparatus for enabling simultaneous viewing of a plurality of files with respect to a common parameter.

A further object of the invention is to provide an improved method and apparatus for analyzing related log file data.

These and other aspects and attributes of the present invention will be discussed with reference to the following drawings and accompanying specification.

BRIEF DESCRIPTION OF THE DRAWINGS

FIG. 7 is a flow chart of an example of synchronously updating displays in accordance with the invention.

DETAILED DESCRIPTION OF THE PREFERRED EMBODIMENT

Figure 1:
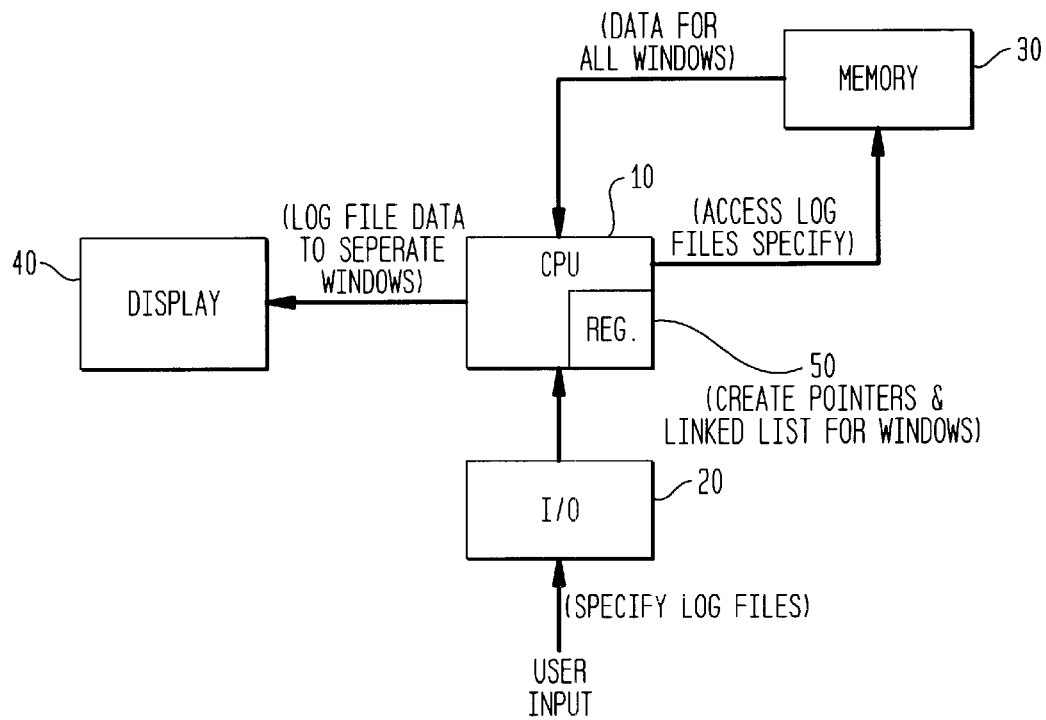
FIG. 1 is a simplified state flow diagram illustrating the setup portion of the inventive method and apparatus.

While this invention is susceptible of embodiment in many different forms, there is shown in the drawing, and will be described herein in detail, specific embodiments thereof with the understanding that the present disclosure is to be considered as an exemplification of the principles of the invention and is not intended to limit the invention to the specific embodiments illustrated. Operational Description from a Users Perspective The user selects a set of log files to be viewed simultaneously on the screen of a computer. In the case of automated testing log files, they contain time stamps at the beginning of each line, e.g. "1999-02-08 14:03:48" (year-month-date hour:minute:second), indicating the time at which the data on that line was generated. Once the log files to be viewed are selected, windows pop up on the screen, each displaying the top of one of the log files. The user points at one of the windows with the mouse and clicks on it, making it the controlling window. The user then clicks on the scroll bar of the controlling window. As the log file in the controlling window scrolls, the log files in the other windows scroll at the same time based on the time stamp displayed in the controlling window. For example, if the lines of the log file being displayed in the controlling window had time stamps of "1999-02-08 14:07:23", the other windows would display the portion of their log files that had that same time stamp. If the log files didn't contain lines of data with that exact time stamp, they would display log file data that had a time stamp nearest in time to that time stamp. In this way, the windows synchronously scroll the log files based on time stamp. The user could click on one of the other windows, and that window, in turn, would become the controlling window, to which the other windows would be synchronized when scrolled.

In the example above, the data in the log files was related to automated test session output. Other types of log file data might also contain time stamps, permitting synchronous scrolling, including medical sensor logs, billing records, credit card transaction logs, etc.

Indeed, time stamps are not the only common parameter that could be used to synchronously scroll multiple log files. Inventory part numbers, credit card numbers, personnel ID numbers, shipping and tracking numbers, etc. are all possible common parameters that could be used to associate multiple log files and synchronously scroll them with respect to that parameter.

Referring to FIG. 1, a central processing unit (CPU) 10 is coupled to an input/output port (I/O) 20, to a memory 30, to a display 40. CPU 10 includes a conventional computer and its attendant ROM and RAM, not illustrated, as well as a register 50. I/O 20 may be a keyboard input, an accessory device input, such as another computer, a mouse input, etc. Memory 30 includes a database of log files corresponding to various operating or test parameters of equipment at various locations that are monitored on a regular basis. The various log files may include one or more common parameters by which they may be correlated. For example, in the preferred embodiment, the common parameter is a time stamp that indicates the time that a particular piece of data in the log file was received. It will be appreciated that the invention is not to be limited to the use of a time stamp as the common parameter and that any other parameter, such as part number, location, etc. may be used with the invention. It will also be appreciated that the present invention is not limited to log files or testing, and has general applicability to simultaneously viewing a plurality of display windows which synchronously scroll together. Memory 30 is updated on a regular basis by test routines on the various equipment in the test system. This updating of memory is well-known in the art, and none of this is illustrated as it is not germane to the invention.

As indicated in FIG. 1, a user input may comprise a specification of a particular group of log files that are desired to be viewed simultaneously on display 40. In practice, the user has a list of directories and a list of the available log files for each of the directories. From these lists, the user may select a group of log files for simultaneous viewing in separate windows of display 40 and for synchronized scrolling with respect to a common parameter or reference, in this instance a time stamp. After the user selects the files to be viewed, a software function in CPU 10 generates a list of unique time stamps and file positions associated with each unique time stamp for each log file, then populates arrays in register 50 with this information (one array per log file). It will be appreciated that while an array is used in the preferred embodiment, other arrangements, such as linked lists of pointers, may be used where appropriate. Once the arrays are populated, a software function in CPU 10 accesses each array, gets the file position of the first time stamp for each log file, then displays that portion of each log file from memory 30 in a separate window on display 40 at that starting position. In general, this position will correspond to the beginning or top of each log file.

Figure 2:
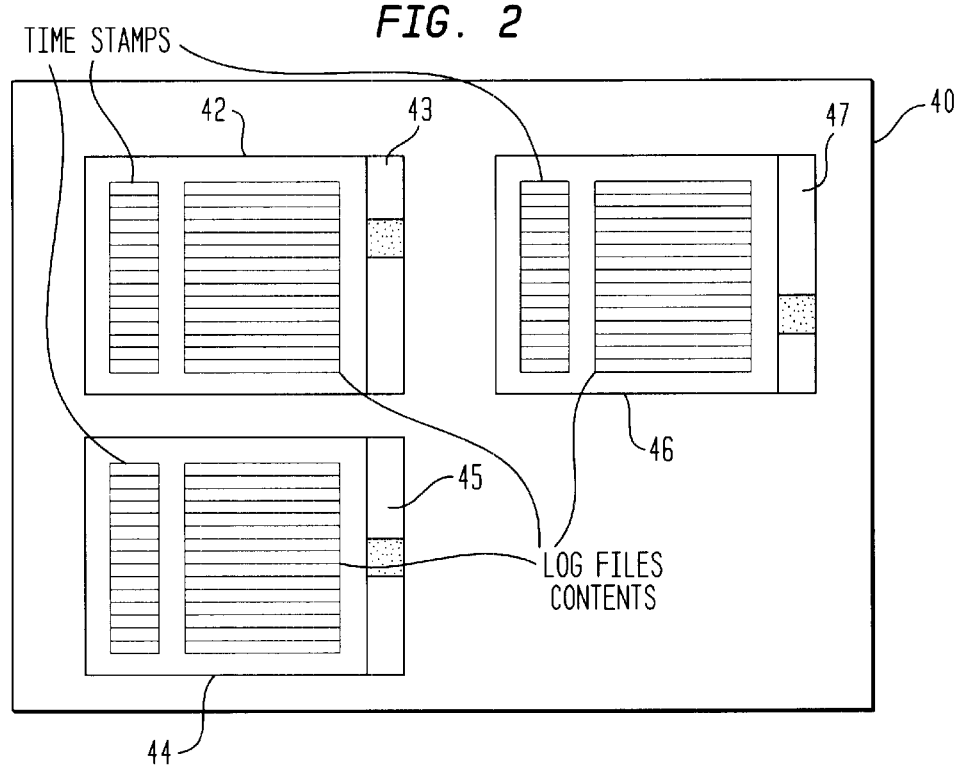
FIG. 2 illustrates a typical display screen with three separate log file windows in accordance with the invention.

In FIG. 2, a representative illustration of display 40, with three separate windows 42, 44 and 46, is shown presenting information from three selected log files. Each of windows 42, 44 and 46 include a scroll bar, identified by the reference numbers 43, 45 and 47, respectively, at their right-hand sides. At the left side of each window is a display of the time stamp and adjacent thereto is a display of the contents of the log file corresponding to the associated time stamp. While not shown, contents of the log file corresponding to any unique time stamp (or common parameter) may be highlighted for viewing ease. The separate windows and scroll bars are well known in the art, and scrolling of the displayed data is accomplished by clicking on the buttons associated with the scroll bar with a mouse. Alternatively, keyboard control of scrolling may also be accomplished, which is especially useful with the synchronized scrolling feature of the invention.

Figure 3:
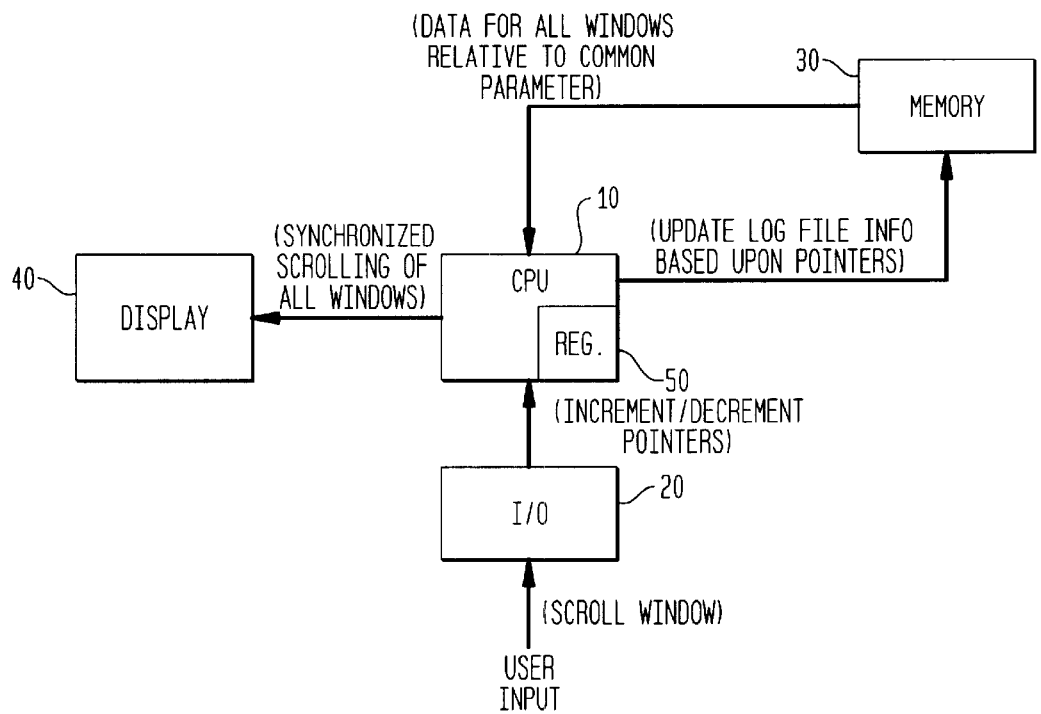
FIG. 3 is a simplified state flow diagram illustrating the synchronized scrolling of the method and apparatus of the invention.

In FIG. 3, the various elements are the same, but the descriptive portions differ to illustrate operation of the invention. Thus the arrangement of CPU 10, I/O 20, memory 30, display 40 and register 50 is the same as that shown in FIG. 1. A "scroll down" user input command is applied to I/O 20, typically by the user clicking on the scroll bar of one of the windows. In response, a software function in CPU 10 gets the next unique time stamp and file position from the array in register 50 for the log file associated with that window. A software function in CPU 10 then displays that portion of the log file from memory 30 in the window on display 40. A software function in CPU 10 then searches the arrays in register 50 associated with the other log files for a time stamp that matches (or in this embodiment, is the closest to) the new time stamp in the window that was first scrolled.

For each of these remaining log files, a software function in CPU 10 displays that portion of the log file from memory 30 in its associated window on display 40 that corresponds to this new time stamp. In this way, the other windows scroll their respective log files to time stamps that match (or are nearest to) the new time stamp in the first window, and the windows have been synchronously scrolled.

In practice, for ease of viewing, the time stamp of the log file data displayed in the middle of the window may be used as the current, or reference time stamp. With respect to time stamps, it will be appreciated (as shown above) that approximate correlation between the various time stamps may be provided for rather than requiring identical time stamps. Thus, a certain maximum time difference between time stamps in the different windows may be used when synchronizing the scrolling. Other file content data (such as names, ID numbers, event numbers, part numbers, etc.) may be used to reference the synchronized scrolling of the window information. The criterion is that the reference parameter be one that is common to each of the selected group of files. Also, it is not necessary that each line of data within the log files contain the common parameter. The common parameter could be associated with a group of lines, e.g. a time stamp that is just one field in a billing record.

Software Implementation of the Preferred Embodiment

It will be appreciated that the invention is substantially fully software based, and is implemented in the Java programming language using an object-oriented software design. To that end, attention is directed to FIGS. 4 and 5, which illustrate the relationships between a parent object and child objects (window objects in this invention) and the contents of a window object, respectively.

Figure 4:
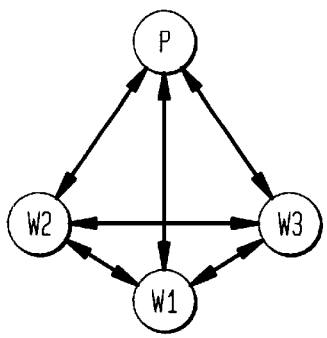
FIG. 4 illustrates the relationship that exists among window objects and a parent object as implemented via an Object-Oriented (OO) software design.

FIG. 4 shows the relationship between three window objects $W_1$, $W_2$ and $W_3$, corresponding to three log files selected by the user for viewing, and a parent object P containing information about each window object.

Figure 5:
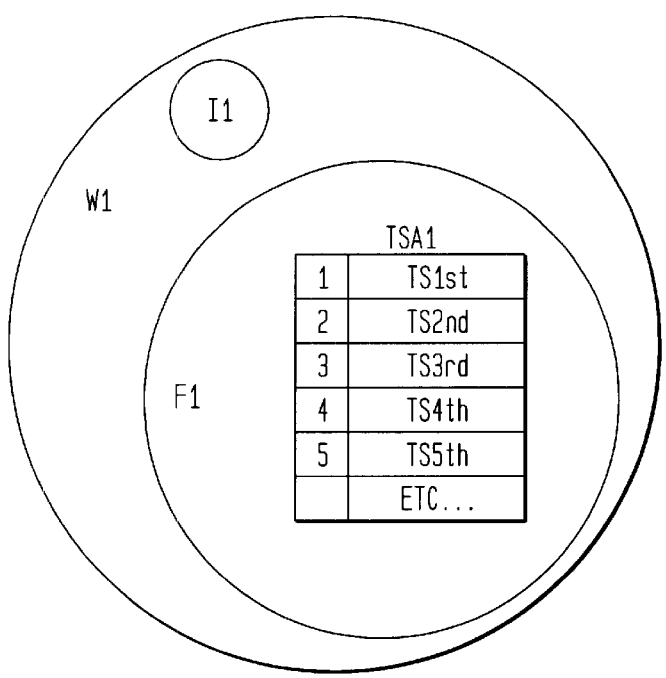
FIG. 5 illustrates the content of a window object as implemented via an OO software design.

In. FIG. 5, a window object $W_1$ is seen to contain an interface object $I_1$ and a file object $F_1$. The file object $F_1$, in turn, contains time stamp array $TSA_1$, which in turn contains an array of time stamp objects $TS_{1st}$, $TS_{2nd}$, $TS_{3rd}$, etc.

The nomenclature and interrelationships of the various elements are well known to those skilled in the software art. The following description provides functional flow of the software for initializing and performing synchronous scrolling in the above-described preferred embodiment of the invention.

Initialization of Windows

Figure 6:
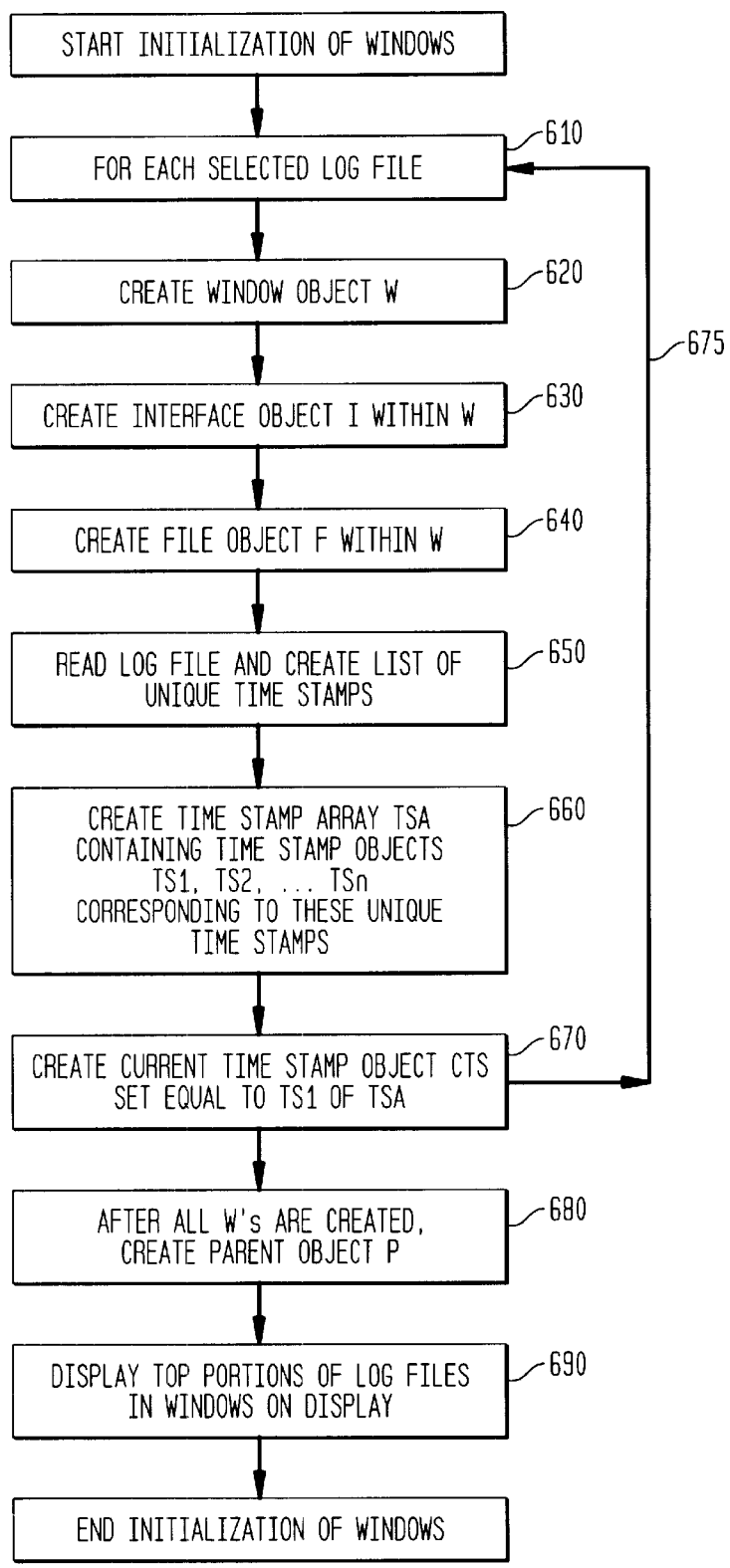
FIG. 6 is a flow chart of the initialization of objects and data structures of the present invention.

The initialization of windows is shown in the flow chart of FIG. 6 and described herein. When the log files to be simultaneously viewed are selected, a window object W is instantiated (created) for each selected log file as shown in step 620. For example, if three log files were selected, three window objects $W_1$, $W_2$, and $W_3$ are created.

Within each window object W, an interface object I is created in step 630, which contains software functions to display a portion of the log file on display 40 and receive input from the user at I/O 20. A file object F is also instantiated within each window object in step 640, holding the contents of the log file and information about the file (e.g. the size of the file). In this example, the window object $W_1$ would contain an interface object $I_1$ and a file object $F_1$, the window object $W_2$ would contain an interface object $I_2$ and a file object $F_2$, and the window object $W_3$ would contain an interface object $I_3$ and a file object $F_3$.

For each file object F, a function 650 is executed that reads (line by line) the log file contained in F, creating a list of the unique time stamps contained in the log file. For each of these unique time stamps, a time stamp object TS is instantiated containing (A) the time stamp itself, (B) the beginning line number of that time stamp within the log file, (C) the ending line number of that time stamp within the log file, (D) the beginning character position of that time stamp within the log file, and (E) the ending character position of that time stamp within the log file. Time stamp objects $TS_{1st}$, $TS_{2nd}$, to $TS_{nth}$ are populated in a time stamp array TSA in step 660, wherein the 1st index of the TSA array corresponds to $TS_{1st}$, the 2nd index of the array corresponds to $TS_{2nd}$, etc. In this example, the file object $F_1$ contains an array of time stamp objects $TSA_1$, the file object $F_2$ contains its own unique array of time stamp objects $TSA_2$, and the file object $F_3$ contains its own unique array of time stamp objects $TSA_3$.

Lastly in step 670, each window object W must populate a current time stamp object CTS with the contents of a time stamp object TS found in it's own time stamp array TSA.

The initial CTS is usually associated with the top portion of the log file, and thus time stamp object $TS_{1st}$. In this example, the window object $W_1$ would have a current time stamp object $CTS_1$ set to the time stamp object that corresponds to $TSA_1[1]$, the window object $W_2$ would have a current time stamp object $CTS_2$ set to the time stamp object that corresponds to $TSA_2[1]$, and the window object $W_3$ would have a current time stamp object $CTS_3$ set to the time stamp object that corresponds to $TSA_3[1]$. The process flow repeats via 675 to step 610 for each of the user's selected log files as shown in FIG. 6.

Once each of the window objects is instantiated as described above, a parent object P is instantiated in step 680, containing information regarding each window object W. In this respect, each window object W is a child of the parent object P. If a child window object W is dynamically added or deleted while the program is running (for example, the user opens or closes a window displaying a log file), the parent object P is updated accordingly. Each window object W is given access to the information stored in the parent object P, therefore each window object W has "awareness" of its sibling window objects. In the continuing example, the parent object P contains information regarding the window objects $W_1$, $W_2$, and $W_3$, thus the window object WI has information regarding its sibling window objects $W_2$ and $W_3$ via the parent object P.

Once the parent object and all window objects are instantiated, in step 690 each window object W, using functions in its interface object I, displays a portion of the log file in its file object F corresponding to its current time stamp object CTS in a window on the display 40. The portion of the file displayed is related to the beginning/ending line and beginning/ending character position information stored in the CTS object. The mechanism within the interface object for displaying a file in a window is well known and is not claimed as part of this invention. In this example, three windows would appear, corresponding to the window objects $W_1$, $W_2$, and $W_3$, displaying the tops of the log files stored in file objects $F_1$, $F_2$, and $F_3$ respectively.

Synchronous Scrolling of Windows

Synchronous scrolling of windows is outlined in the flow chart of FIG. 7 and described herein with an example. When a user clicks (I/O 20) on the scroll bar of one of the windows, a scroll event is generated. In this example, the user generated a scroll down event $E_{down}$, an event intended to synchronously scroll the content of all the displayed windows to a subsequent time stamp. Note that the following functional flow is also applicable to a scroll up event $E_{up}$, one which is intended to synchronously scroll the content of all the displayed windows to a previous time stamp. In this example, $E_{down}$ was generated by clicking on the scroll bar of the window associated with window object $W_1$. Note that the functional flow below would be similar if the user had clicked on the scroll bar of $W_2$ or $W_3$.

When an interface object I of a window object W detects a scroll event in step 710, W becomes a "controlling window" $W_{controlling}$, defined to be the window object to which the other window objects of the shared parent object P will synchronize. In this example, when the interface object 11 of the window object $W_1$ detects the scroll down event $E_{down}$, $W_1$ becomes the "controlling window", to which the other window objects $W_2$ and $W_3$ will synchronize. In step 720, interface object $I_1$ first determines the current time stamp by accessing the window object $W_1$'s current time stamp object $CTS_1$. As shown in step 730, $I_1$ then references $W_1$'s time stamp array $TSA_1$ to find a subsequent time stamp object $TS_{next}$. $CTS_1$ is then updated to $TS_{next}$ in step 740. In this example, if $CTS_1$ originally contained $TSA_1[m]$, the m-th unique time stamp, it would now contain $TSA_1[m+1]$, the (m+1)-th unique time stamp. After $CTS_1$ is thus updated, in step 750 the interface object $I_1$ accesses the new beginning/ending line and character position information stored in $CTS_1$, then updates display 40 to display this new portion of the log file within window object $W_1$.

Once the handling of the scroll down event $E_{down}$ is complete in $W_{controlling}$, the parent object P is queried to determine the other sibling windows that need to be scrolled as shown in step 760. A scroll down message (or function call) is sent from the interface object I of the "controlling window" $W_{controlling}$ to the interface objects $I_S$ of sibling window objects $W_S$ in step 797. In this example, a scroll down message is sent from the interface object $I_1$ of the "controlling window" $W_1$ to the interface objects $I_2$ and $I_3$ of sibling window objects $W_2$ and $W_3$, respectively. The scroll down message causes $I_2$ to reference $TSA_2$ as shown in step 770 and find therein a time stamp object that matches that of the controlling window $W_1$'s $CTS_1$. If an exact match is not found, the time stamp object of the stamps in time stamp array $TSA_2$ that is closest to that of $CTS_1$ is chosen. As shown in step 780, $CTS_2$ is then updated to contain the new time stamp object $TSA_2$[closest-match-to-$CTS_1$], and $I_2$ uses the new beginning/ending line and character position information now stored in $CTS_2$ to update display 40 as shown in step 790, with the new portion of the log file associated with the window object $W_2$. Likewise, interface object $I_3$ references $TSA_3$ and finds $TSA_3$[closest-match-to-$CTS_1$]. $CTS_3$ is then updated to contain the new time stamp object, and $I_3$ uses the new beginning/ending line and character position information now stored in $CTS_3$ to update display 40 with the new portion of the log file associated with the window object $W_3$.

The result of the process flow in this example is that window objects $W_2$ and $W_3$ now display the portions of their respective log files in which their time stamps match (or are closest to) the "controlling window" $W_1$'s new current time stamp $CTS_1$. When all of sibling windows have been updated, retracing path 795 as many times as required, the synchronous scrolling event is complete, and all windows are ready for the next scroll event triggered by the user.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

What is claimed is:

1. A method of analyzing data in different log files comprising:
    providing a display device having a plurality of windows;
    providing a database of different test data log files acquired from a plurality of separate test systems;
    selecting a group of test data log files from the database, for simultaneous viewing in corresponding ones of the plurality of windows; and
    in response to a scroll command, simultaneously scrolling the group of the test data log files, displayed in the corresponding windows, with respect to a common parameter.

2. The method of claim 1, wherein the database comprises a memory and further comprising:

accessing the memory with a computer; and inputting the file selections and scroll commands to the computer.

3. The method of claim 2, further comprising:

providing a scroll bar for each of the plurality of windows; and controlling any scroll bar to simultaneously scroll all of the plurality of windows.

4. The method of claim 3, further comprising:

generating a function call between window objects in response to scrolling of one of the scroll bars; and synchronously scrolling the other of the plurality of windows in response to the function calls.

5. The method of claim 2, wherein the common parameter is a time stamp in the different files.

6. The method as in claim 3, further comprising:

simultaneous scrolling in different directions for at least two of the plurality of windows.

7. A system for analyzing data in different files comprising:

a computer means having a port for inputting the selection of a group of a plurality of the test data log files acquired from a plurality of separate test systems to be simultaneously viewed in corresponding windows on a display device;

a memory, in said computer means, storing said plurality of the files; each of said plurality of the files having a common parameter; and said computer means, in response to a scroll command, accessing said memory to simultaneously scroll said group of the test data log files, displayed in said corresponding windows, with respect to said common parameter.

8. The system of claim 7, wherein each of said plurality of windows includes a scroll bar; and said computer means generating a function call between window objects in response to scrolling of one of said scroll bars for synchronously scrolling the other of the plurality of windows in response to the function call.

9. The system of claim 7, wherein said common parameter is a time stamp in each of said group of the files.

10. The system as in claim 8, wherein the scroll bar is positioned in a relatively fixed position for each of the plurality of windows.

11. The system as in claim 8, wherein the scroll bar is positioned in relatively different positions within at least two of the plurality of windows.

12. The system as in claim 8, wherein scrolling occurs in the same direction for all the plurality of windows.

13. The system as in claim 8, wherein the scrolling occurs in different directions for at least two of the plurality of windows.

* * * * *